United States Patent
Ina et al.

(10) Patent No.: US 7,053,961 B2
(45) Date of Patent: May 30, 2006

(54) SYSTEM AND METHOD FOR TV AUTOMATIC GAIN CONTROL (AGC)

(75) Inventors: Norihisa Ina, San Diego, CA (US); Hiromichi Sano, San Diego, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 0 days.

(21) Appl. No.: 10/781,289

(22) Filed: Feb. 17, 2004

(65) Prior Publication Data

US 2005/0179820 A1 Aug. 18, 2005

(51) Int. Cl.
*H04N 5/52* (2006.01)
(52) U.S. Cl. .................... 348/678; 348/731
(58) Field of Classification Search .............. 348/678, 348/725, 726, 731; 725/119; 455/232.1
See application file for complete search history.

(56) References Cited

U.S. PATENT DOCUMENTS

| | | | | |
|---|---|---|---|---|
| 5,258,764 A | * | 11/1993 | Malinowski | 342/359 |
| 5,636,252 A | | 6/1997 | Patel et al. | 375/345 |
| 5,638,112 A | | 6/1997 | Bestler et al. | 348/10 |
| 5,774,194 A | * | 6/1998 | Armbruster | 348/726 |
| 5,926,744 A | * | 7/1999 | Fukuzawa et al. | 725/69 |
| 5,940,143 A | | 8/1999 | Igarashi et al. | 348/678 |
| 6,005,640 A | * | 12/1999 | Strolle et al. | 348/726 |
| 6,020,936 A | * | 2/2000 | Brekelmans | 348/725 |
| 6,028,647 A | * | 2/2000 | Fukai et al. | 348/731 |
| 6,081,565 A | | 6/2000 | Marandi et al. | 375/345 |
| 6,094,236 A | * | 7/2000 | Abe et al. | 348/731 |
| 6,281,945 B1 | * | 8/2001 | Jun et al. | 348/678 |
| 6,348,955 B1 | * | 2/2002 | Tait | 348/731 |
| 6,353,463 B1 | * | 3/2002 | Seo | 348/731 |
| 6,369,857 B1 | | 4/2002 | Balaban et al. | 348/555 |
| 6,377,316 B1 | * | 4/2002 | Mycynek et al. | 348/731 |
| 6,421,098 B1 | * | 7/2002 | Oya | 348/678 |
| 6,438,361 B1 | * | 8/2002 | Chong et al. | 455/188.1 |
| 6,459,458 B1 | * | 10/2002 | Balaban | 348/678 |
| 6,483,553 B1 | | 11/2002 | Jung | 348/731 |
| 6,542,203 B1 | | 4/2003 | Shadwell et al. | 348/726 |
| 6,609,039 B1 | * | 8/2003 | Schoen | 700/94 |
| 6,622,308 B1 | | 9/2003 | Raiser | 725/151 |
| 6,650,878 B1 | | 11/2003 | Abe et al. | 455/232.1 |
| 6,728,524 B1 | * | 4/2004 | Yamanaka et al. | 455/232.1 |
| 2001/0016950 A1 | | 8/2001 | Matsuura | 725/111 |
| 2002/0131533 A1 | | 9/2002 | Koizumi | 375/345 |
| 2003/0025841 A1 | * | 2/2003 | Sawyer | 348/734 |
| 2004/0004673 A1 | | 1/2004 | Jeong et al. | 348/678 |
| 2004/0063413 A1 | * | 4/2004 | Schaffer et al. | 455/234.1 |
| 2004/0207761 A1 | * | 10/2004 | Paik et al. | 348/678 |
| 2004/0229561 A1 | * | 11/2004 | Cowley et al. | 455/3.01 |
| 2004/0259512 A1 | * | 12/2004 | Busson et al. | 455/190.1 |
| 2005/0022249 A1 | * | 1/2005 | Shibusawa | 725/119 |
| 2005/0032495 A1 | * | 2/2005 | Stalf et al. | 455/232.1 |

* cited by examiner

*Primary Examiner*—Paulos M. Natnael
(74) *Attorney, Agent, or Firm*—John L. Rogitz

(57) ABSTRACT

In a terrestrial mode of a TV having analog and digital capability, the RF gain is controlled using the TV's IF tuner output. In a digital cable mode the RF gain is controlled using the output of the TV's IF SAW filter, and in an analog cable mode the RF gain is controlled using the output of an analog demodulator.

12 Claims, 2 Drawing Sheets

SYSTEM AND METHOD FOR TV AUTOMATIC GAIN CONTROL (AGC)

FIELD OF THE INVENTION

The present invention relates generally to television automatic gain control (AGC).

BACKGROUND

Both the RF and IF gain of a television may be automatically controlled to improve picture quality. The RF gain may be controlled under high signal strength conditions and the IF gain under low signal strength conditions.

Both gains may be controlled using a signal from the TV's digital demodulator and/or the TV's analog demodulator, but as recognized herein this scheme can result in large distortions particularly when cable signals are received (i.e., in a cable mode of the TV). The distortion in turn causes picture deterioration in the analog channel, and result in pixellation errors or no picture at all for digital channels. Alternatively, the RF gain can be controlled using the tuner output (i.e., the IF signal produced by the tuner prior to demodulation), but this can introduce undesirable noise, again resulting in, e.g., pixellation errors or no picture at all for digital channels.

Having recognized these drawbacks, the solutions below are provided.

SUMMARY OF THE INVENTION

A system includes a television tuner having at least one radiofrequency (RF) gain adjust amplifier and generating an intermediate frequency (IF) output signal. A filter such as a SAW filter receives the IF output signal and outputs a filtered IF output signal. A demodulator demodulates the IF signal to provide a signal for display on a television display. In the present invention, the RF gain adjust amplifier receives, as input, the IF output signal when the system is in a terrestrial mode and at least one of: the filtered IF output signal, and a signal from the demodulator, when the system is in a cable mode. Specifically, in non-limiting embodiments the RF gain adjust amplifier receives, as input, the filtered IF output signal in a digital cable mode and a signal from the demodulator in an analog cable mode.

If desired, an IF gain adjust amplifier can be provided to receive the IF output signal or the filtered IF output signal. The IF gain adjust amplifier may receive, as input, an output signal from the demodulator. One or both of an analog and digital demodulator may be provided.

In some embodiments a first power detection circuit includes a first control voltage amplifier interposed between the tuner and the RF gain adjust amplifier. The first power detection circuit receives the IF output signal. A second power detection circuit can be provided which includes a second control voltage amplifier interposed between the filter and the RF gain adjust amplifier, with the second power detection circuit receiving the filtered IF output signal. A second switch can receive the outputs of at least one control voltage amplifier. If desired, a first power detection line can connect the IF output signal to a single second switch and a second power detection line can connect the filtered IF output signal to the single second switch.

In another aspect, a method for controlling a radiofrequency (RF) gain of a television system includes, when the television system is in a terrestrial mode, controlling the gain using an intermediate frequency (IF) signal output by a television tuner. The method also includes, when the television system is in a digital cable mode, controlling the gain using a filtered IF signal output by a filter, and when the television system is in an analog cable mode, controlling the gain using a signal output by a demodulator.

In still another aspect, a system for controlling the radiofrequency (RF) gain of a television includes means for controlling an RF gain of the television, and means for generating an intermediate frequency (IF) signal. Means are provided for filtering the IF signal to render a filtered IF signal. Switch means select which signal to send to the means for controlling, based on a mode of the television.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
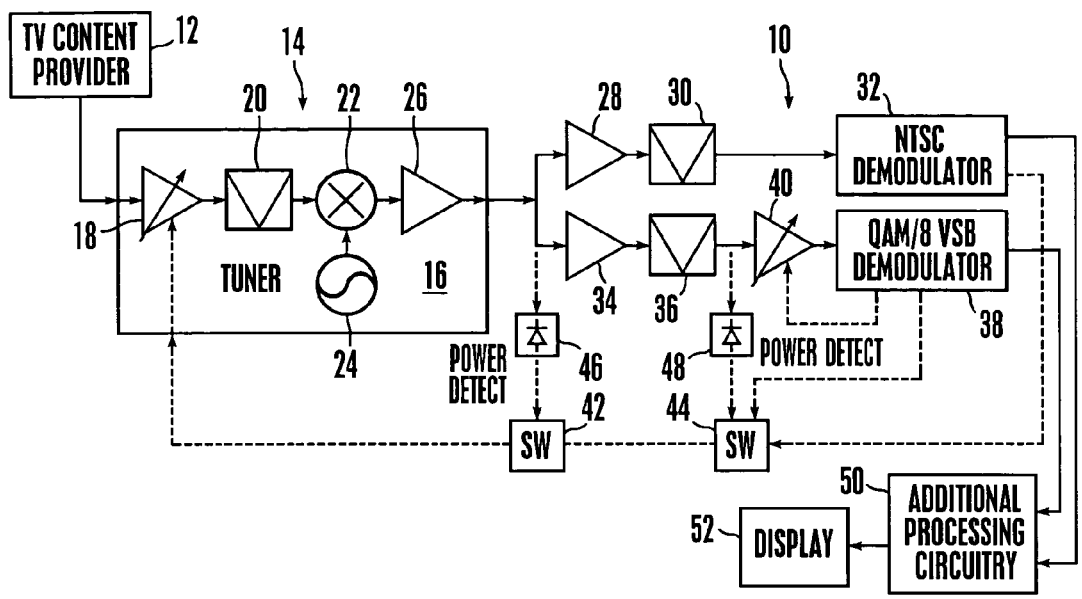
FIG. 1 is a block diagram of the present TV system.

Referring initially to FIG. 1, a system is shown, generally designated 10, in which a TV content provider 12 (only one provider shown for clarity) provides terrestrial and cable TV signals to a television system, generally designated 14, the relevant portions of which are shown in FIG. 1 and described herein. It is to be understood that the content provider 12 can be one or more providers or sources such as cable/terrestrial boxes, wires, antennae, satellites, etc.

The TV system 14 includes a tuner 16 that can in turn include, in series from input to output, an RF gain control amplifier 18 that receives the input radiofrequency (RF) signal, a filter 20, a mixer 22 that receives a downconvert signal from an oscillator 24, and an output amplifier 26. The skilled artisan will recognize that the output of the amplifier 26 is an intermediate frequency (IF) signal.

As shown in the preferred embodiment of FIG. 1, the IF signal from the tuner 16 is sent to an analog channel and a digital channel. More particularly, the IF signal is sent to an analog amplifier 28 and then to a surface acoustic wave (SAW) filter 30, prior to being input to a National Television System Committee (NTSC) demodulator 32. Also, the IF signal is sent to an amplifier 34 and then to a surface acoustic wave (SAW) filter 36 that generates a filtered IF signal, prior to being input after gain control amplification to a digital demodulator 38 such as a quadrature amplitude modulation (QAM)/eight level vestigial sideband (8 VSB) demodulator. More particularly, an IF gain control amplifier 40 is in electrical series with the SAW filter 36 and digital demodulator 38 and receives its control signal from the digital demodulator 38 as shown by the dashed line.

In accordance with the present invention, two automatic gain control (AGC) switches or equivalent structure (e.g., logic gates in a system implemented in software) are provided. Specifically, as shown in FIG. 1 a first switch 42 selectively outputs a gain control signal to the RF gain control amplifier 18 using two inputs. One input to the first switch 42 is selectively from the analog demodulator 32 via a second switch 44, and one input is from the IF output via a first power detection circuit 46, the details of which will be shortly disclosed. The second switch 44 receives input from the analog demodulator 32 and the filtered IF signal from the output of the SAW filter 36 via a second power detection circuit 48. Also, the second switch 44 receives an input from the digital demodulator 38, indicating whether the TV is in a terrestrial mode (i.e., whether the current channel is a terrestrial channel) or a cable mode (i.e., indicating whether the current channel is a cable channel) and indicating a digital or analog cable signal in accordance with principles known in the art. Additional processing circuitry 50 can receive the demodulated signal(s) to drive a TV display 52 in accordance with principles known in the art.

Based on what the signal from the digital demodulator 38 indicates, the circuit of FIG. 1 can assume a terrestrial signal mode, wherein the first switch 42 operates to establish electrical connectivity between the first power detection circuit 46 (and, hence, the IF output signal) and the RF gain control amplifier 18, for adjusting the balance between NF and distortion for the terrestrial signal receiver using the IF output signal. On the other hand, in a digital cable mode, the switches 42, 44 cooperate such that the signal from the second power detection circuit 48 (and, hence, the output of the SAW filter 36) is provided to the RF gain control amplifier 18, for adjusting the balance between NF and distortion for the cable receiver using the SAW filter output. The third possibility—analog cable—invokes an analog cable mode, in which the switches 42, 44 cooperate to connect the analog demodulator 32 to the RF gain control amplifier 18 to control the amplifier 18.

Figure 2:
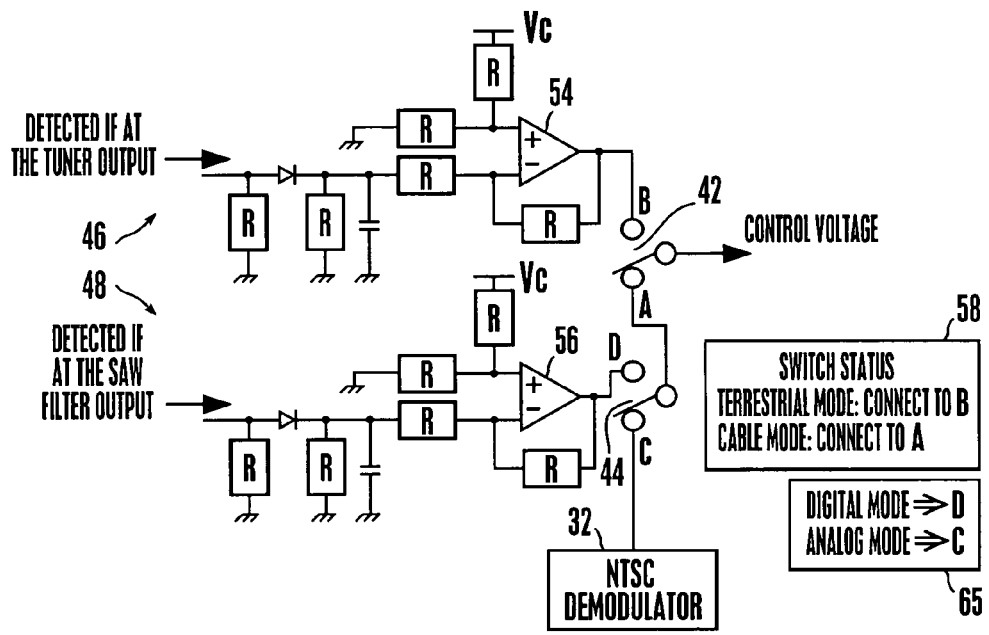
FIG. 2 is a block diagram of a first non-limiting power detection circuitry.
Figure 3:
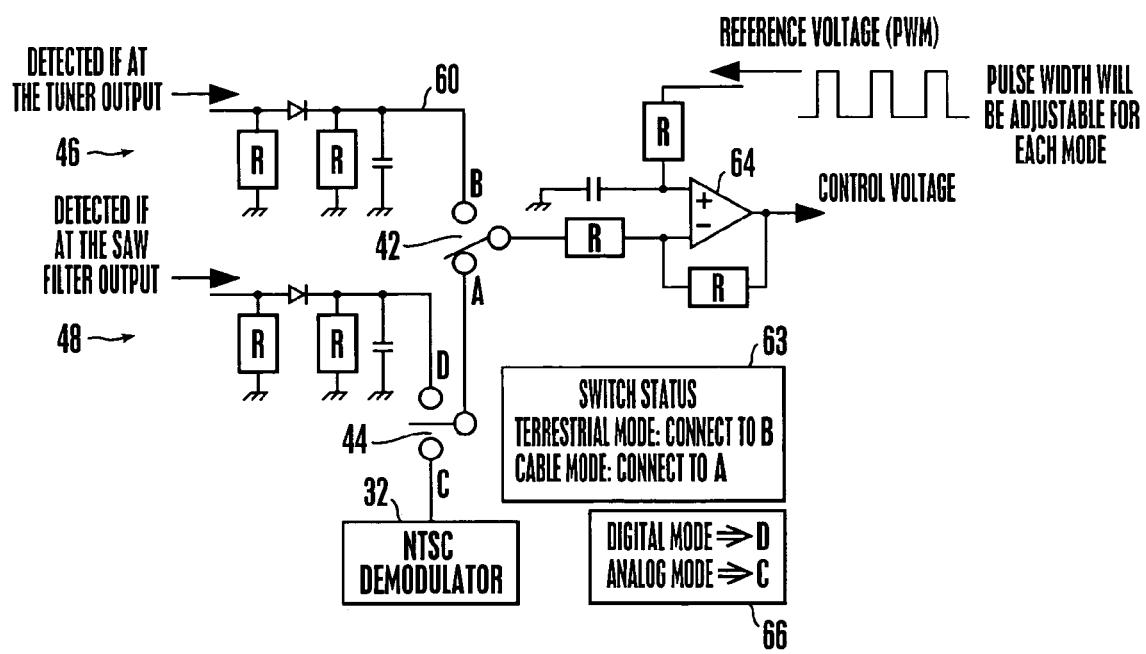
FIG. 3 is a block diagram of a second non-limiting power detection circuitry.

Having described the components and operation of the system 10, attention is directed to FIGS. 2 and 3, which show non-limiting examples of respective implementations of the power detection circuits 46, 48 and the switches 42, 44 shown in FIG. 1. FIG. 2 shows that each circuit 46, 48 can include various resistors (labelled "R") and a respective control signal amplifier 54, 56. Each control signal amplifier receives its own reference voltage (labelled "$V_c$" in FIG. 2) that has a pulse width which is established as appropriate for the particular TV mode associated with the respective amplifier 54, 56, i.e., terrestrial or cable.

As indicated by the box 58, the first switch 42 always connects the IF output of the tuner to the RF gain amplifier 18 in the terrestrial mode, regardless of whether the second switch 44 is in digital or analog mode. On the other hand, in the cable mode, the first switch 42 is connected to the second switch 44, which, as indicated by the box 65, connects the NTSC demodulator output to the RF gain amplifier 32 for analog cable and for analog digital connects the output of the SAW filter 36 (through the second power detection circuit 48) to the RF gain amplifier 18.

In contrast, FIG. 3 shows that in an alternate embodiment, each power detection circuit 46, 48 can include a respective power detection line 60, 62 that can be selectively connected through the switch or switches 42, 44 to a single control signal amplifier 64 to develop the control signal. As indicated in FIG. 3, the reference to the control signal amplifier 64 is pulse width modulated (PWM), with the pulse width being established as appropriate for the particular TV mode. As before, the first switch 42 always connects the IF output of the tuner to the RF gain amplifier 18 in the terrestrial mode, regardless of whether the second switch 44 is in digital or analog mode. On the other hand, in the cable mode, the first switch 42 is connected to the second switch 44, which, as indicated by the box 65, connects the NTSC demodulator output to the RF gain amplifier 32 for analog cable and for analog digital connects the output of the SAW filter 36 (through the second power detection circuit 48) to the RF gain amplifier 18.

While the particular SYSTEM AND METHOD FOR TV AUTOMATIC GAIN CONTROL (AGC) as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". It is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. Absent express definitions herein, claim terms are to be given all ordinary and accustomed meanings that are not irreconcilable with the present specification and file history.

What is claimed is:

1. A system, comprising:
   a television tuner having at least one radiofrequency (RF) gain adjust amplifier and generating an intermediate frequency (IF) output signal;
   at least one filter receiving the IF output signal and outputting a filtered IF output signal;
   at least one demodulator demodulating an IF signal to provide a signal for display on a television display, wherein
   the RF gain adjust amplifier receives, as input, the IF output signal when the system is in a terrestrial mode and at least one of: the filtered IF output signal, or a signal from the demodulator, when the system is in a cable mode, the system further comprising at least one IF gain adjust amplifier receiving at least one of: the IF output signal, or the filtered IF output signal, the IF gain adjust amplifier receiving, as input, an output signal from the demodulator.

2. The system of claim 1, wherein the demodulator is a digital demodulator.

3. A system, comprising:
   a television tuner having at least one radiofrequency (RF) gain adjust amplifier and generating an intermediate frequency (IF) output signal;
   at least one filter receiving the IF output signal and outputting a filtered IF output signal;
   at least one demodulator demodulating an IF signal to provide a signal for display on a television display, wherein
   the RF gain adjust amplifier receives, as input, the IF output signal when the system is in a terrestrial mode and at least one of: the filtered IF output signal, or a signal from the demodulator, when the system is in a cable mode, and further wherein the demodulator is an analog demodulator, and the RF gain adjust amplifier receives, as input, the filtered IF output signal in a digital cable mode and a signal from the demodulator in an analog cable mode.

4. A system, comprising:
a television tuner having at least one radiofrequency (RF) gain adjust amplifier and generating an intermediate frequency (IF) output signal;
at least one filter receiving the IF output signal and outputting a filtered IF output signal;
at least one demodulator demodulating an IF signal to provide a signal for display on a television display, wherein
the RF gain adjust amplifier receives, as input, the IF output signal when the system is in a terrestrial mode and at least one of: the filtered IF output signal, or a signal from the demodulator, when the system is in a cable mode, and further comprising a first power detection circuit including a first control voltage amplifier interposed between the tuner and the RF gain adjust amplifier and receiving the IF output signal and a second power detection circuit including a second control voltage amplifier interposed between the filter and the RF gain adjust amplifier and receiving the filtered IF output signal.

5. The system of claim 4, further comprising a second switch receiving the outputs of at least one control voltage amplifier.

6. A system, comprising:
a television tuner having at least one radiofrequency (RF) gain adjust amplifier and generating an intermediate frequency (IF) output signal;
at least one filter receiving the IF output signal and outputting a filtered IF output signal;
at least one demodulator demodulating an IF signal to provide a signal for display on a television display, wherein
the RF gain adjust amplifier receives, as input, the IF output signal when the system is in a terrestrial mode and at least one of: the filtered IF output signal, or a signal from the demodulator, when the system is in a cable mode, and further comprising a first power detection line connecting the IF output signal to a single second switch and a second power detection line connecting the filtered IF output signal to the single second switch.

7. A method for controlling a radiofrequency (RF) gain of a television system, comprising:
when the television system is in a terrestrial mode, controlling the gain using an intermediate frequency (IF) signal output by a television tuner;
when the television system is in a digital cable mode, controlling the gain using a filtered IF signal output by a filter; and
when the television system is in an analog cable mode, controlling the gain using a signal output by a demodulator, wherein the gain is an RF gain and the acts of controlling are undertaken at least in a strong signal strength condition, and the method also includes controlling an IF gain in a weak signal strength condition using the output of a demodulator.

8. The method of claim 7, wherein the filter is a SAW filter.

9. A method for controlling a radiofrequency (RF) gain of a television system, comprising:
when the television system is in a terrestrial mode, controlling the gain using an intermediate frequency (IF) signal output by a television tuner;
when the television system is in a digital cable mode, controlling the gain using a filtered IF signal output by a filter; and
when the television system is in an analog cable mode, controlling the gain using a signal output by a demodulator, and comprising using a switch to select the input to control the RF gain.

10. The method of claim 9, comprising selecting which signal to use using the switch and then sending the signal to an amplifier to generate a gain control signal.

11. The method of claim 9, comprising generating respective control signals using respective amplifiers receiving the IF signal and filtered IF signal, and then selecting which control signal to use using the switch.

12. A system for controlling the radiofrequency (RF) gain of a television, comprising:
means for controlling an RF gain of the television;
means for generating an intermediate frequency (IF) signal;
means for filtering the IF signal to render a filtered IF signal;
switch means for selecting which signal to send to the means for controlling, based on a mode of the television, wherein when the television is in a terrestrial mode, the switch means selects the IF signal, and when the television is in a cable mode, the switch means selects at least one of: the filtered IF signal, or a signal from a demodulator;
means for controlling an IF gain of the television; and
switch means for selecting which gain to control.

* * * * *